United States Patent
Matsumoto et al.

(10) Patent No.: US 7,450,377 B2
(45) Date of Patent: Nov. 11, 2008

(54) COOLING DEVICE HAVING AIR DUCT EXTENDING TO ELEMENTS TO BE COOLED

(75) Inventors: Hideaki Matsumoto, Kawasaki (JP); Kazuaki Kashiwada, Kawasaki (JP); Kenji Joko, Kawasaki (JP); Masahiko Saito, Kawasaki (JP); Koji Sasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/312,954

(22) Filed: Dec. 21, 2005

(65) Prior Publication Data

US 2007/0064387 A1 Mar. 22, 2007

(30) Foreign Application Priority Data

Sep. 20, 2005 (JP) ............................. 2005-272328

(51) Int. Cl.
*H05K 5/00* (2006.01)
*H05K 7/20* (2006.01)

(52) U.S. Cl. ..................................... 361/687

(58) Field of Classification Search ................ 361/687, 361/695, 725, 686, 690, 694, 692; 174/15.1, 174/52.4; 165/104.33; 439/487
See application file for complete search history.

(56) References Cited

U.S. PATENT DOCUMENTS

| | | | | |
|---|---|---|---|---|
| 3,925,710 A | * | 12/1975 | Ebert | 361/690 |
| 5,361,188 A | * | 11/1994 | Kondou et al. | 361/695 |
| 5,502,869 A | * | 4/1996 | Smith et al. | 15/326 |
| 6,174,172 B1 | * | 1/2001 | Kazama | 439/66 |
| 6,559,662 B1 | * | 5/2003 | Yamada et al. | 324/751 |
| 6,574,102 B2 | * | 6/2003 | Usui et al. | 361/687 |
| 6,618,248 B1 | * | 9/2003 | Dalheimer | 361/687 |
| 6,745,495 B1 | * | 6/2004 | Riddle et al. | 34/497 |
| 6,772,856 B2 | * | 8/2004 | Ishii | 181/210 |
| 7,097,111 B2 | * | 8/2006 | Riley et al. | 236/49.3 |
| 7,197,820 B2 | * | 4/2007 | Sugawa et al. | 29/847 |
| 2005/0225936 A1 | * | 10/2005 | Day | 361/687 |
| 2007/0059022 A1 | * | 3/2007 | Yamaoka et al. | 399/92 |

FOREIGN PATENT DOCUMENTS

JP 4-252098 9/1992

* cited by examiner

*Primary Examiner*—Chandrika Prasad
(74) *Attorney, Agent, or Firm*—Staas & Halsey LLP

(57) ABSTRACT

A cooling device able to blow cooling air in a larger amount than a conventional amount and in addition selectively with respect to a specific cooled element even in a case where an area of an intake port which can be secured in a front surface of a case to be cooled inside is restricted small. This cooling device is constituted by an air duct spread in a bag shape from the intake port into the case. At least a group of small openings oriented to the cooled element is provided in a wall of this air duct. Then, cooling air is blown from this group of small openings for the cooling.

8 Claims, 21 Drawing Sheets

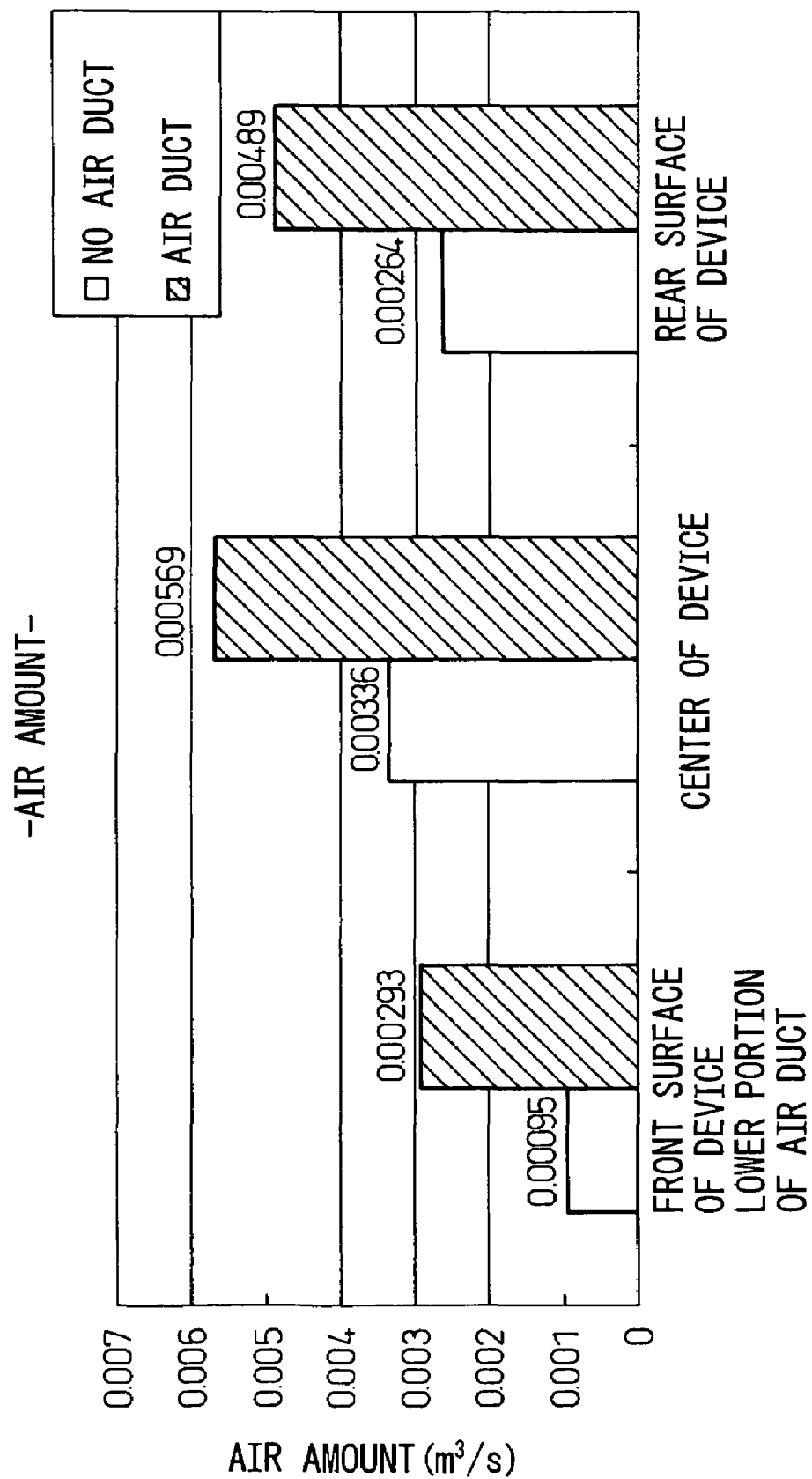

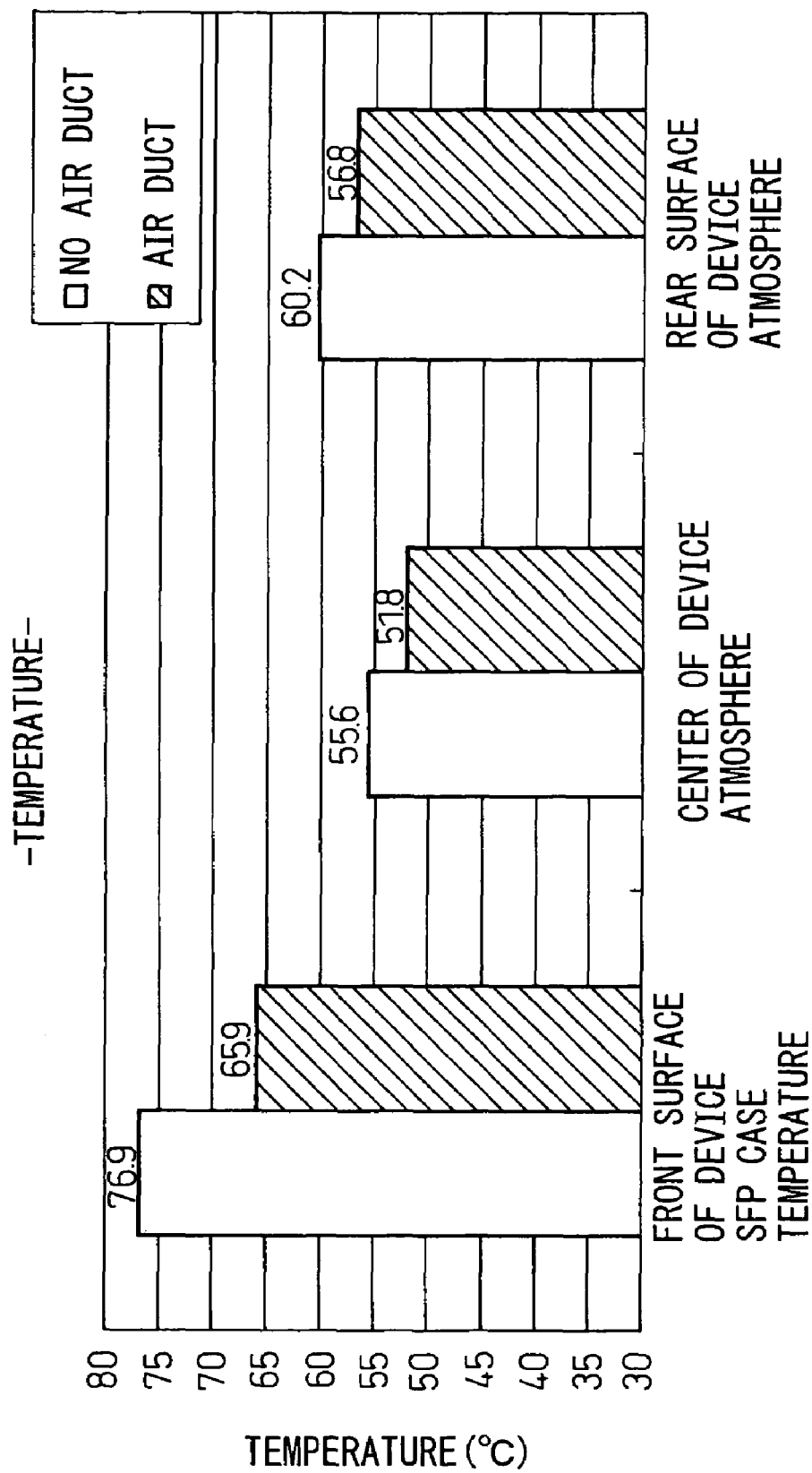

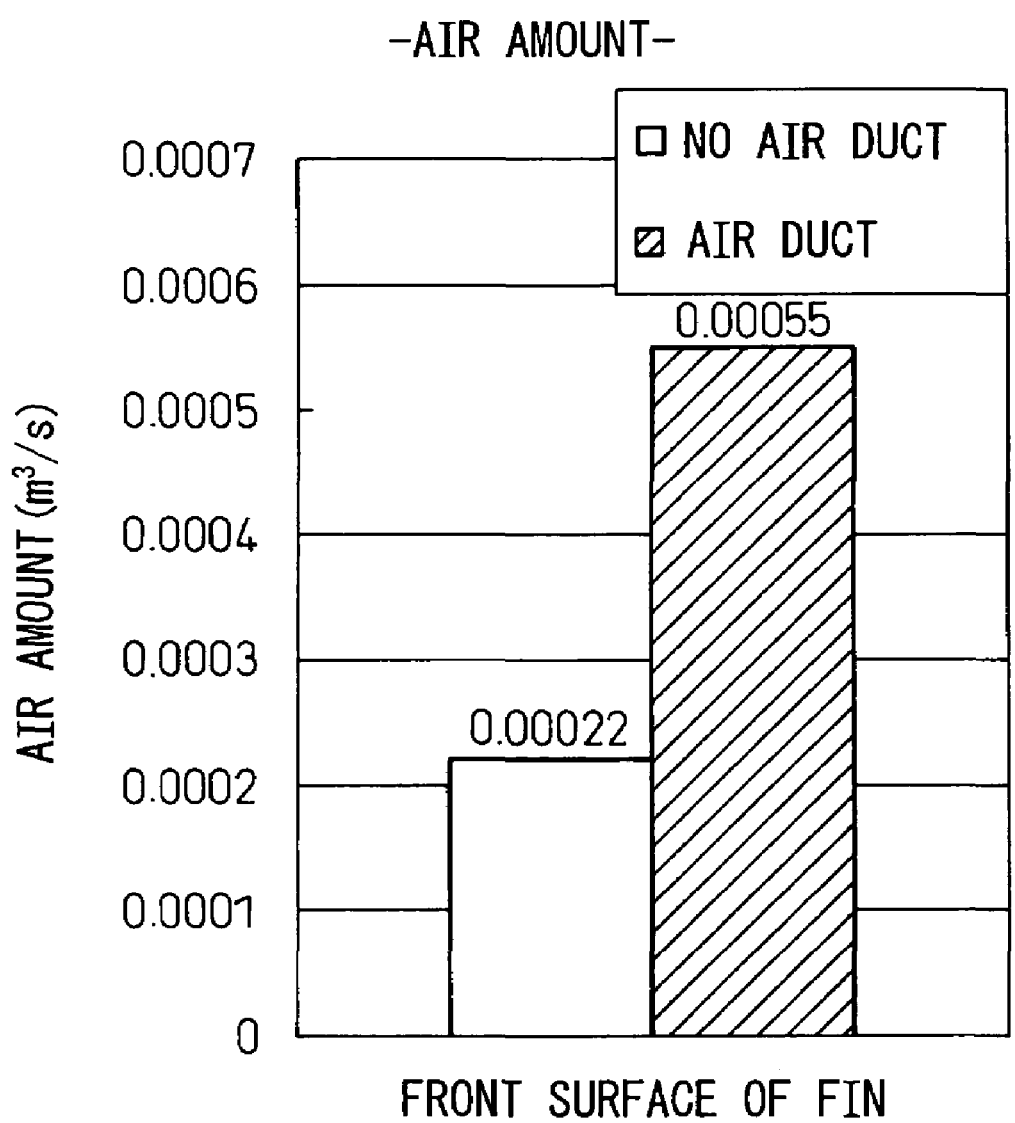

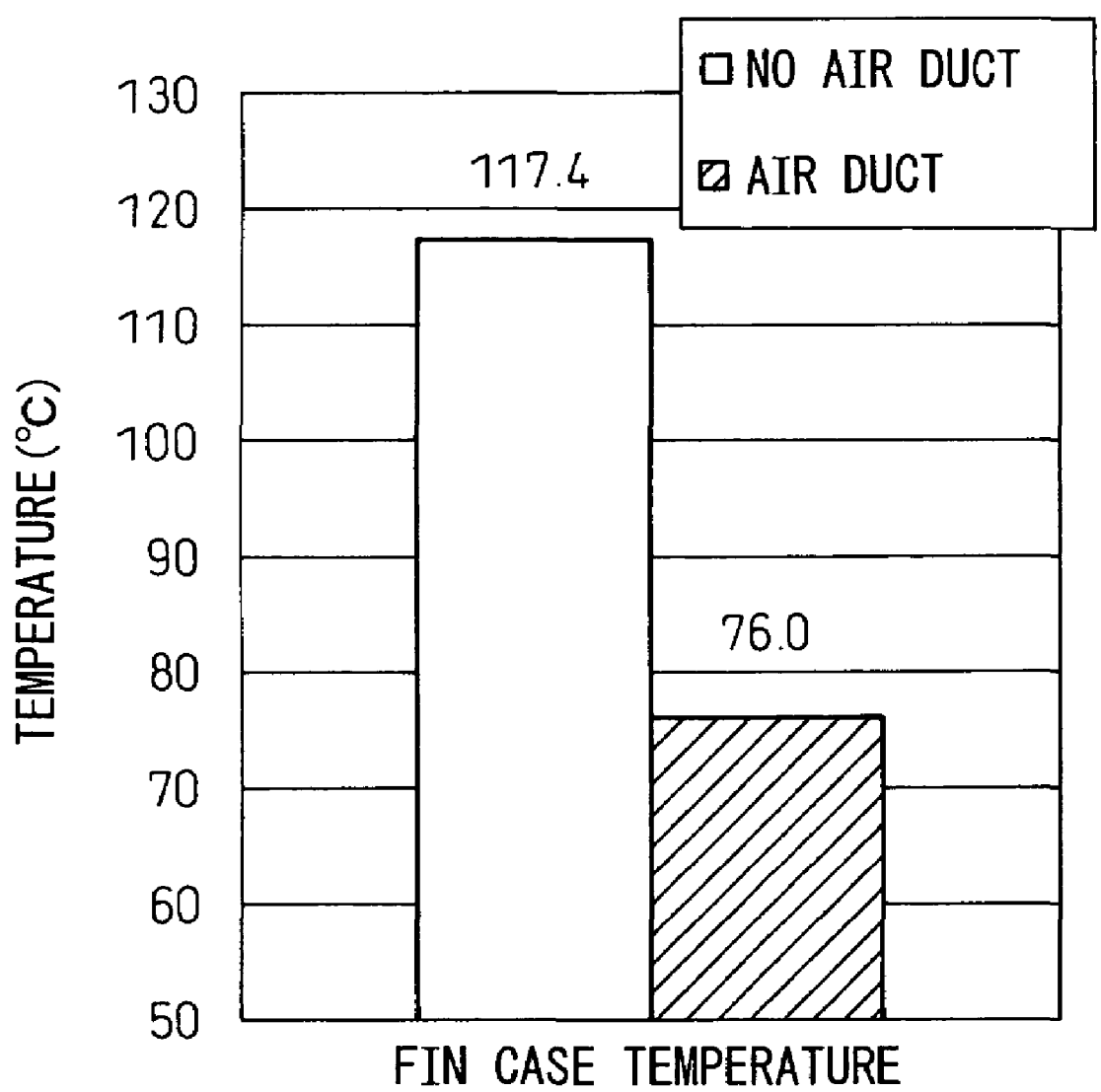

COOLING DEVICE HAVING AIR DUCT EXTENDING TO ELEMENTS TO BE COOLED

BACKGROUND OF THE INVENTION

1. Field of the Invention

The present invention relates to a cooling device for cooling the inside of a case holding cooled elements.

2. Description of the Related Art

There are many examples in may industrial fields of cases for holding cooled elements to which the present invention can be applied. In the present invention, however, in order to facilitate the understanding, a communication device in the field of electronics, especially the field of information communication, will be explained as a preferred example of such a case.

A communication device is generally constituted by a large number of integrated circuits (ICs) and large scale integrated circuits (LSIs) mounted on a substrate and surrounded by a case. These ICs and LSIs have been increased in density in recent years and further have been given higher functions and therefore have become much larger in power consumption. Accordingly, naturally the amount of heat generated in the case forming the communication device becomes enormous. It becomes necessary to efficiently dissipate this generated heat from the case.

However, along with the increasingly sophisticated functions of the communication devices explained above, the operating frequency of the electronic circuits have become higher and have reached the GHz order. Here, so-called electromagnetic compatibility (EMC) countermeasures have becomes necessary, therefore a complete shield structure is required for the cases. However, such a shield structure makes it further difficult to efficiently dissipate the enormous generated heat from the case.

Thus, a cooling device for efficiently cooling a large number of cooled elements (ICs, LSIs, etc.) accommodated in a case has become indispensable particularly for communication devices in recent years.

Further, in recent years, due to the rapid spread of the Internet, communication devices used by for example carriers have increasing used cases provided with Ethernet® ports as interfaces. Specifically, for example, a large number of RJ-45/SFP (small form-factor pluggable) modules are being mounted as interfaces on particularly the front surfaces of communication devices.

However, in communication devices in carriers etc. mounting such RJ-45/SFP modules on the front surface of the cases, as will be explained later by using FIG. 20, special care is required.

Note that as a known art related to the present invention, there is Japanese Patent Publication (A) No. 4-252098. However, this known art does not suggest the technical idea of "employment of an air duct" characterizing the present invention and explained later.

In communication devices having ports for the above RJ-45/SFP modules etc. as a large number of interfaces on the front surface of the cases, usually intakes port are provided at the same front surfaces. For this reason, the areas which can be allotted to the intake ports on the front surfaces become much smaller. In addition, in for example communications device used by carriers described above, a plurality of the same communication devices are stacked in standard sized racks in multiple stages, therefore the heights which can be given to individual communication devices, that is, the heights of the front surface portions, are naturally restricted. In the final analysis, it is almost impossible to further increase the areas which can be allotted to the intake ports for increasing the cooling capability.

In addition, in a communication device described above, a temperature within a range of from for example 0° C. to 110° C. can be guaranteed for electrical system parts such as ICs and LSIs arranged inside the case, but only a temperature within a relatively narrow range of from for example 0° C. to 75° C. can be guaranteed for the RJ-45/SFP modules arranged on the front surface of the case. This is because these modules are optical interfaces for opto/electric conversion and electro/optic conversion including elements with extremely easily changing temperature-wavelength characteristics. For this reason, a higher cooling capability is required for the front surface side (optical interface module) more than the inside (electrical system parts) of the case. In a conventional cooling device, however, the above problem has not yet been solved due to the restriction of the height of the front surface explained above.

SUMMARY OF THE INVENTION

Accordingly, an object of the present invention is to provide a cooling device provided in a case that cannot secure an intake port having a sufficiently wide area in a front surface and able to supply a sufficient amount of cooling air from the intake port to cooled elements (optical interface modules) on the front surface of the case and to cooled elements (electrical system parts) inside the case irrespective of the intake port having such a small area.

To attain the above object, according to one aspect of the present invention, there is provided a cooling device constituted by an air duct (5) spread in a bag shape from an intake port (4) into a case (2). The walls (6) of this air duct (5) are provided with at least one group of small openings (7) facing the cooled elements. Cooling is carried out by blowing cooling air from the group of small openings (7). Due to this, even in the case where the area of the intake port which can be secured at the front surface of the case to be cooled inside is restricted small, a larger amount of cooling air than the conventional amount can be blown and in addition blown selectively to a specific cooled element.

BRIEF DESCRIPTION OF THE DRAWINGS

There and other objects and features of the present invention will become clearer from the following description of the preferred embodiments given with reference to the attached drawings, wherein:

FIG. 16 is a view showing a comparison of the amount of air with a conventional case;

FIG. 17 is a view of a comparison of the temperature with a conventional case;

FIG. 18 is a view of a comparison of the amount of air according to individual cooling with a conventional case;

FIG. 19 is a view of a comparison of the temperature according to individual cooling with a conventional case;

DESCRIPTION OF THE PREFERRED EMBODIMENTS

Preferred embodiments of the present invention will be described in detail below while referring to the attached figures.

Figure 1:
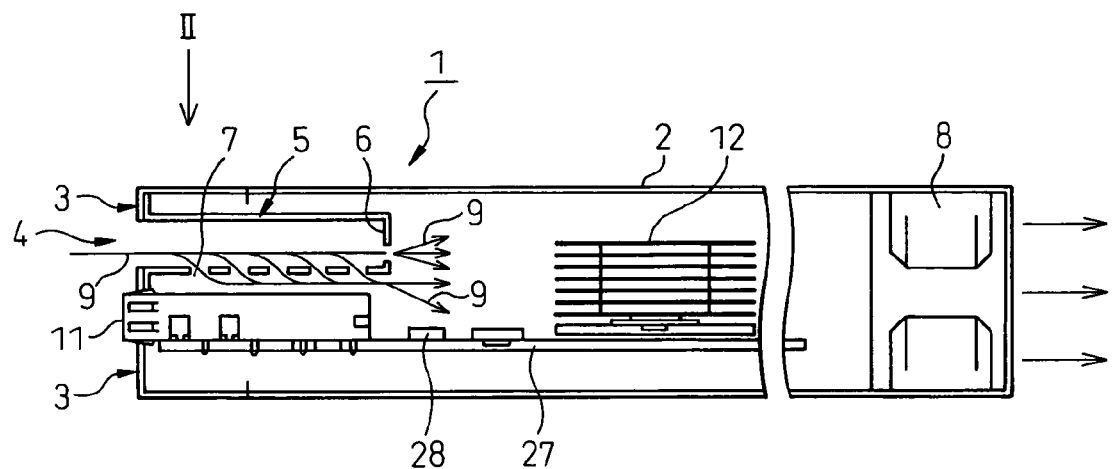
FIG. 1 is a sectional view showing the basic configuration of a cooling device according to the present invention.

FIG. 1 is a sectional view showing the basic constitution of a cooling device according to the present invention. In this sectional view, a cooling device 1 according to the present invention is a cooling device provided in a case provided with at least an intake port 4 at a front surface 3 and an exhaust fan 8 for sucking in air from this intake port 4 to the inside and cooling the inside of the case 2. Here, the characteristic feature of the device 1 of the present invention resides in that this device 1 is constituted by an air duct 5 spread in a bag shape from the intake port 4 into the case 2 and provided with a group of small openings 7 in at least part of its walls 6.

Here, the air duct 5 blows inflowing air 9 from the intake port 4 through the group of small openings 7 to at least predetermined cooled elements (11, 12) in the case 2. Note that as the predetermined cooled elements, in the present figure, a first cooled element 11 and a second cooled element 12 are shown. The first cooled element 11 is for example the RJ-45/SFP module explained above, while the second cooled element 12 is for example the LSI equipped with heat radiation fins. According to the figure, it is understood that the inflowing air 9 is concentratedly blown to the RJ-45/SFP module (11) upon with strict conditions are placed on the temperature-wavelength characteristic and that highly efficient cooling is carried out.

As will be clear later with reference to FIG. 21 to FIG. 23, the group of small openings (reference numeral 7 in FIG. 1) for EMC countermeasures explained above was conventionally formed at the entrance of the intake port 4 at the front surface 3 of the case 2 in the same plane as the front surface 3. In this case, the total opening area of the group of small openings 7, that is, the total blowing area of the inflowing air 9, is S1. Contrary to this, in the present invention, the total opening area of the group of small openings 7, that is, the total blowing area of the inflowing air 9, becomes several times S1 (S1+S2+S3+ . . . ) or more. This means a rapid increase of the cooling capability. If diagrammatically representing this, this becomes as follows.

Figures 2A, 2B:
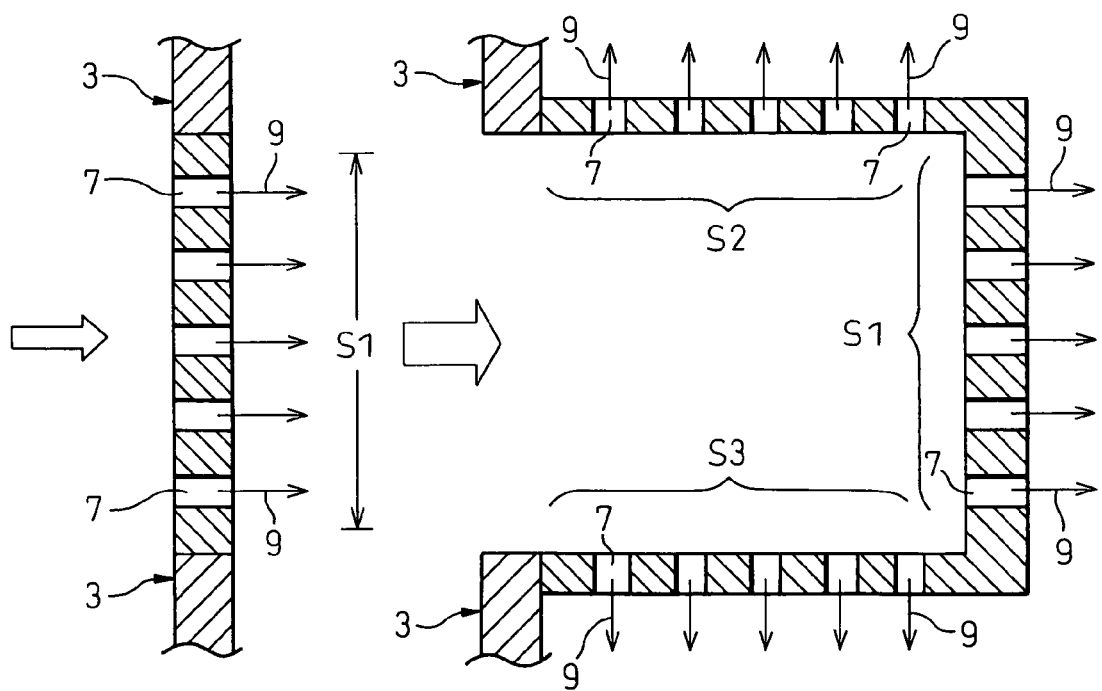
FIGS. 2A and 2B are views diagrammatically showing the increase of the cooling capability according to the present invention.

FIGS. 2A and 2B are views schematically illustrating the increase of the cooling capability according to the present invention and are planar sectional views along the arrow II in FIG. 1. Note that the same reference numerals or symbols are assigned to same components throughout all drawings.

In FIG. 2A showing the conventional type, the total blowing area of the inflowing air 9 from the group of small openings 7 is the S1 described above. Contrary to this, in FIG. 2B according to the present invention, the total blowing area of the inflowing air 9 from the group of small openings 7 into the case 2 does not stop at S1, but further greatly increases to S2, S3, . . . . In addition, the destinations of blowing of the inflowing air 9 can be set as spots or changed. Thus, according to the present invention, an amount of cooling air of several times the conventional amount or more can be sent into the case 2 and the cooling target thereof can be freely set.

First of all, the background behind which the present invention was reached will be simply touched upon, then the embodiments of the present invention will be explained.

Figure 20:
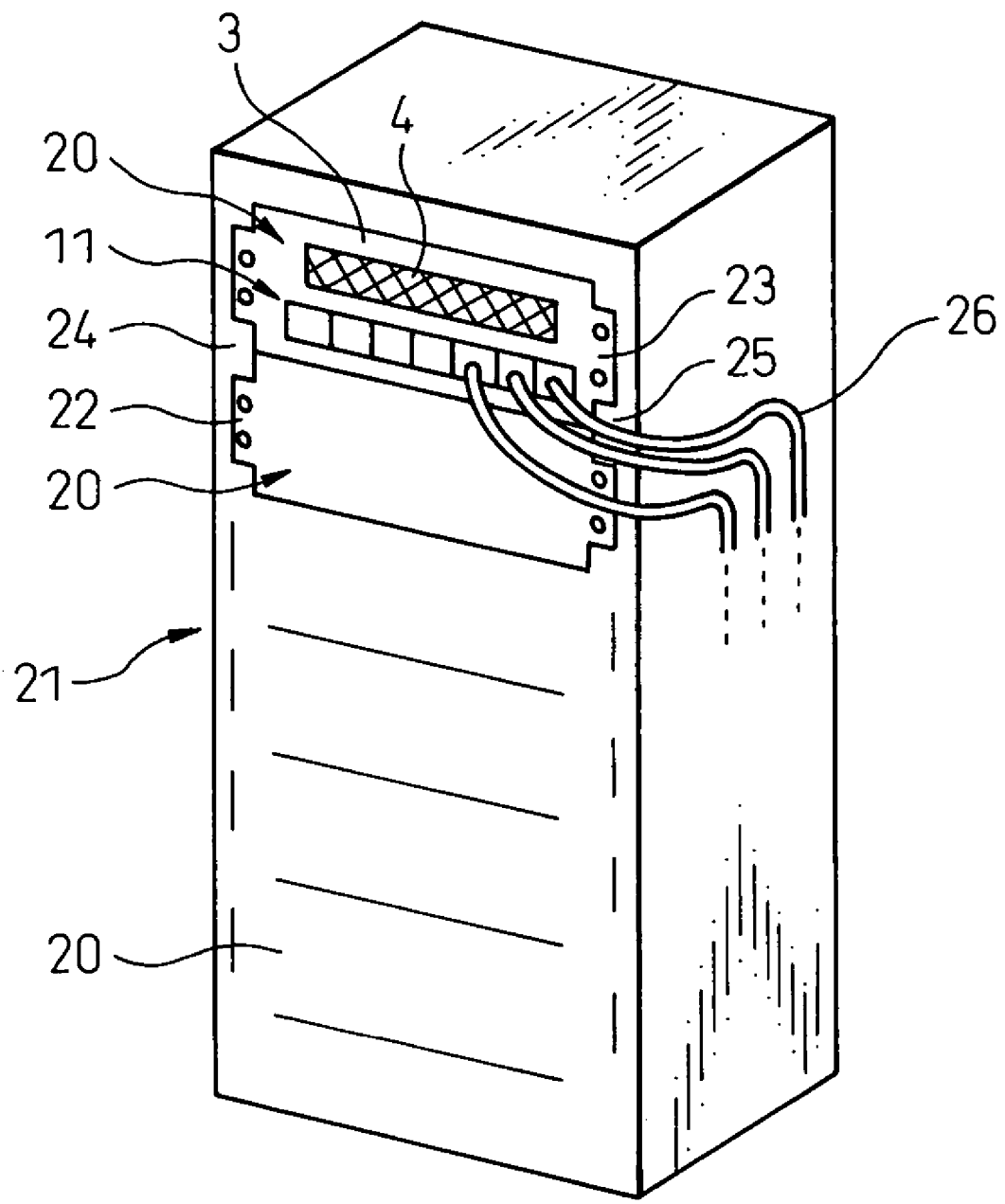
FIG. 20 is a view showing a mode of use of a communication device according to an example of application of the present invention.

FIG. 20 is a view showing a mode of use of a communication device as an example of application of the present invention. The figure shows a communication device as a preferred example of the case 2 of FIG. 1 by reference numeral 20. In the already explained carriers, a large number of such communication devices 20 are accommodated in open racks 21 having for example widths of about 50 cm.

The communication devices 20 are stacked in multiple stages in the open racks 21. In this case, ribs 22 and 23 projecting out at both of the left and right ends of each communication device 20 (case 2) are screwed to struts 24 and 25. Note that, for simplification, only a communication device 20 at the uppermost stage will be shown in detail.

The front surface 3 of each communication device 20 is provided with the above intake port 4 and an RJ-45/SFP module (first cooled element 11). This module (11) has a large number of pairs of transmission and reception fiber cables 26 connected to it. Some of these fiber cables 26 are connected to other communication devices in the same rack (21), while the remaining cables are connected to other racks (not shown).

Such communication devices 20 are stacked in multiple stages in the vertical direction. According to the standard, at most a height of 44.45 cm can be secured per stage (per communication device). For this reason, at the front surface 3 of each communication device 20, the intake port 4 will be formed in the remaining extremely small region after securing the mounting space of the module (11). Accordingly, this intake port 4 naturally has a small area.

Note that an open rack 21 is provided with the above described struts and routing use cable ducts on both the left and right sides. Therefore, usually the cooling mechanism has a front surface intake/back surface exhaust structure. A conventional example of this cooling mechanism will be explained below.

Figure 21:
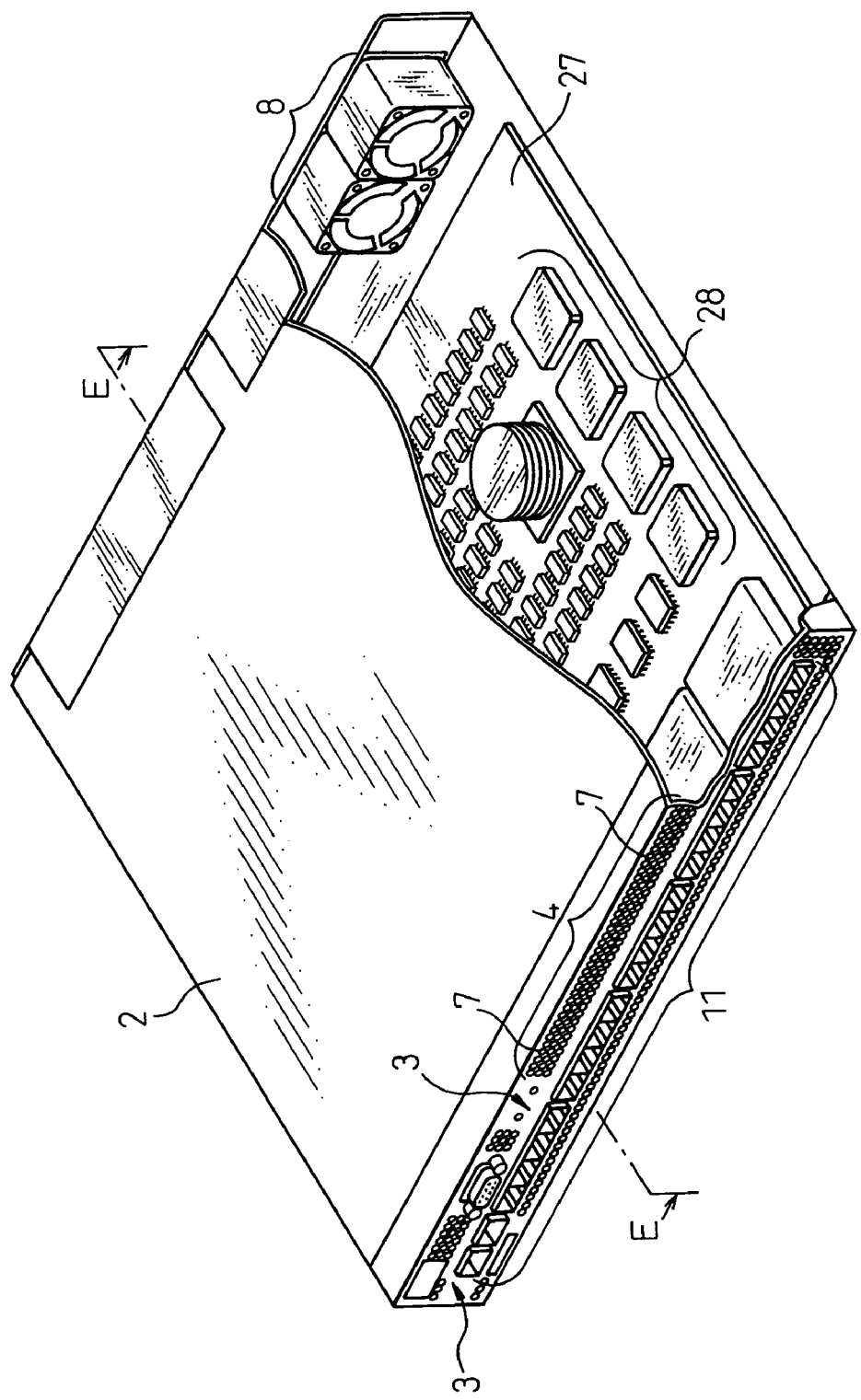
FIG. 21 is an overall perspective view of a conventional communication apparatus.

FIG. 21 is an overall perspective view of a conventional communication device 20; FIG. 22 is a partially enlarged view of FIG. 21; and FIG. 23 is a sectional view taken along the line E-E in FIG. 21. Among these FIG. 21 to FIG. 23, FIG. 23 best shows the difference from the present invention.

Figure 23:
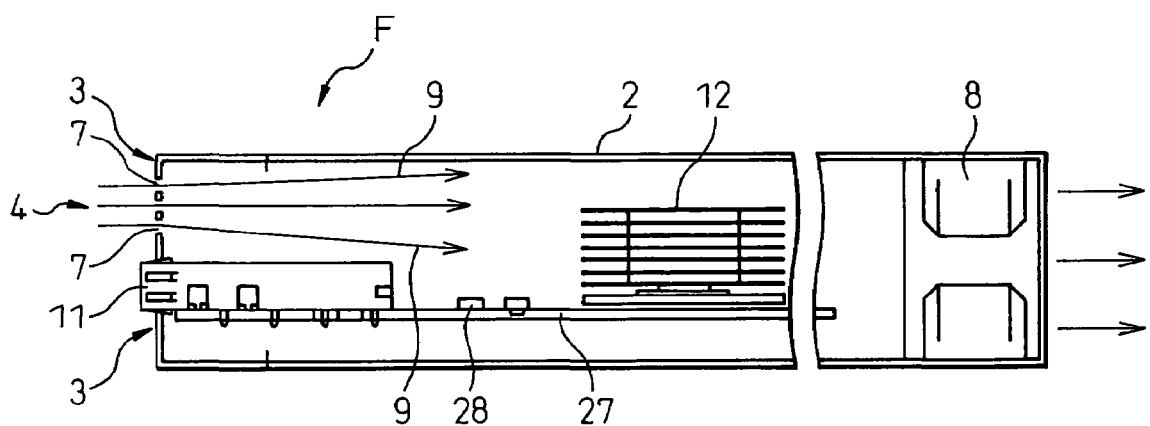
FIG. 23 is a sectional view taken along a line E-E of FIG. 21.

When comparing FIG. 23 of the conventional example and the aforeexplained FIG. 1 according to the present invention, there is no mechanism which can be called a cooling device in the F portion of FIG. 23. For this reason, in the conventional example (FIG. 23), the inflowing air 9 from the group of small openings 7 of the intake port 4 only flows out toward the back surface (8) of the case 2. That is, the inflowing air 9 selectively blown to specific elements among the various large number of cooled elements 28 mounted on the printed board 27. In addition, a larger amount of inflowing air 9 than the conventional amount cannot be supplied there. Note that, as the cooled elements 28, various types of ICs and LSIs are drawn (FIG. 21).

Figure 3:
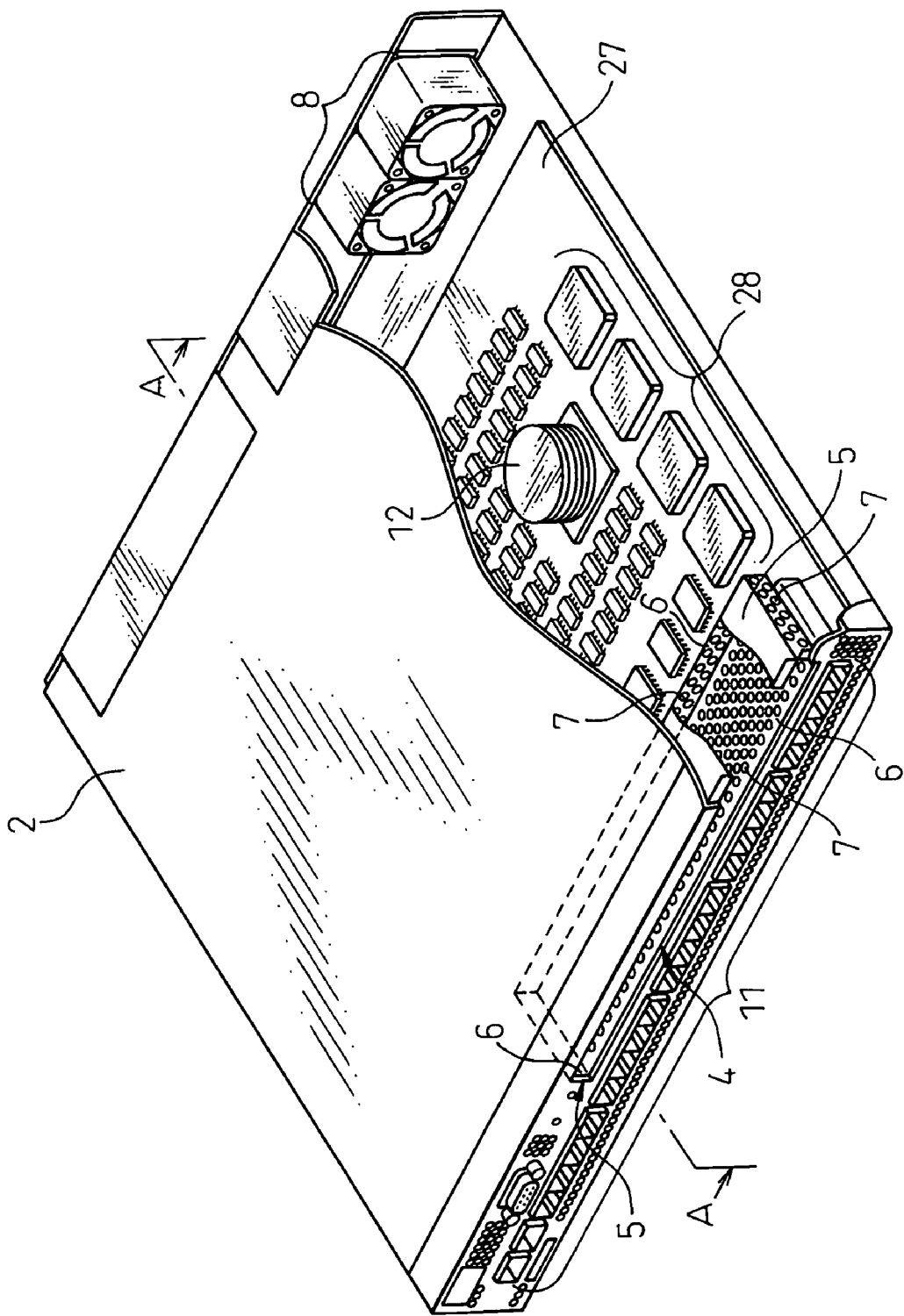
FIG. 3 is an overall perspective view of a cooling device according to a first embodiment of the present invention.
Figure 4:
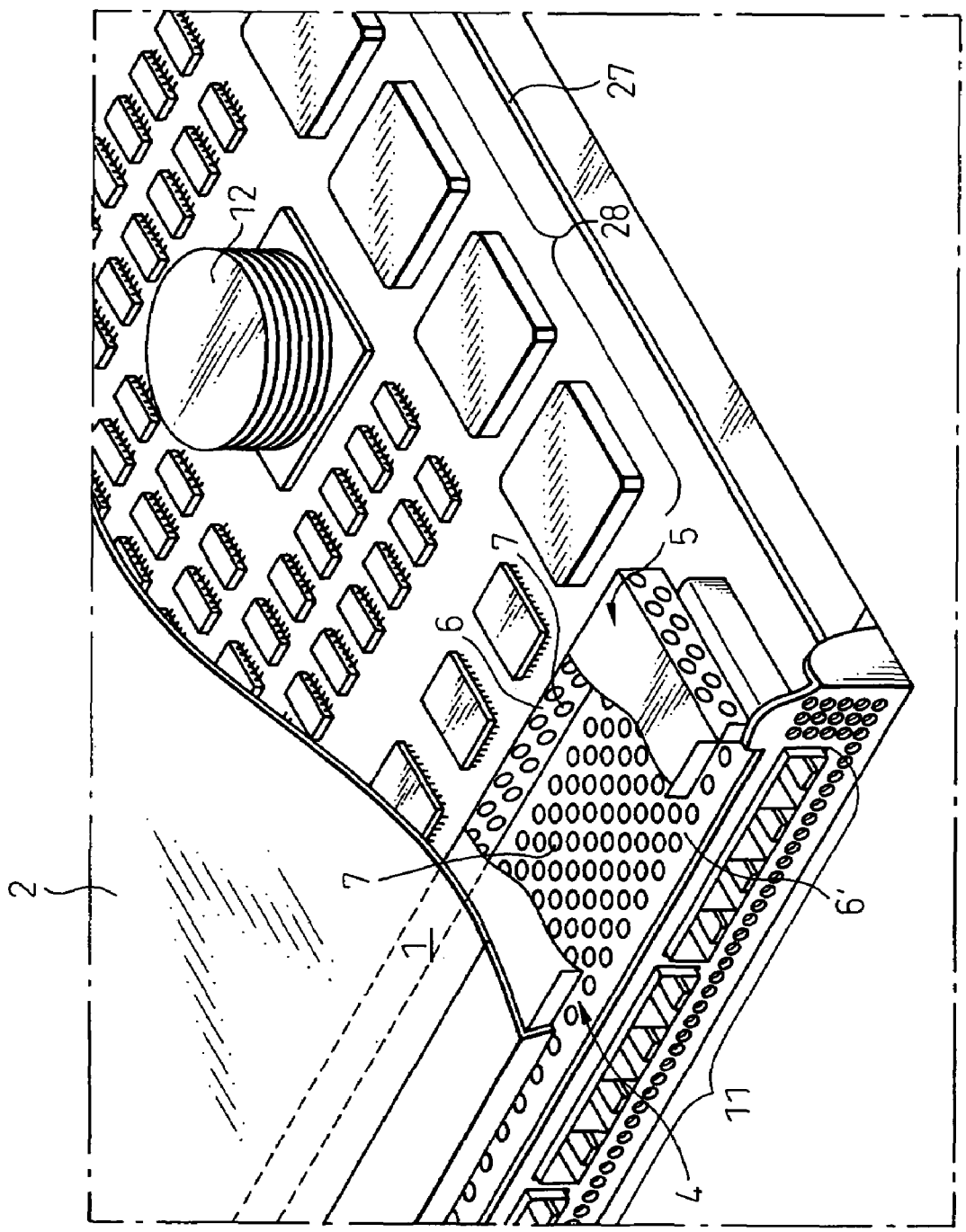
FIG. 4 is a partially enlarged view of FIG. 3.
Figure 5:
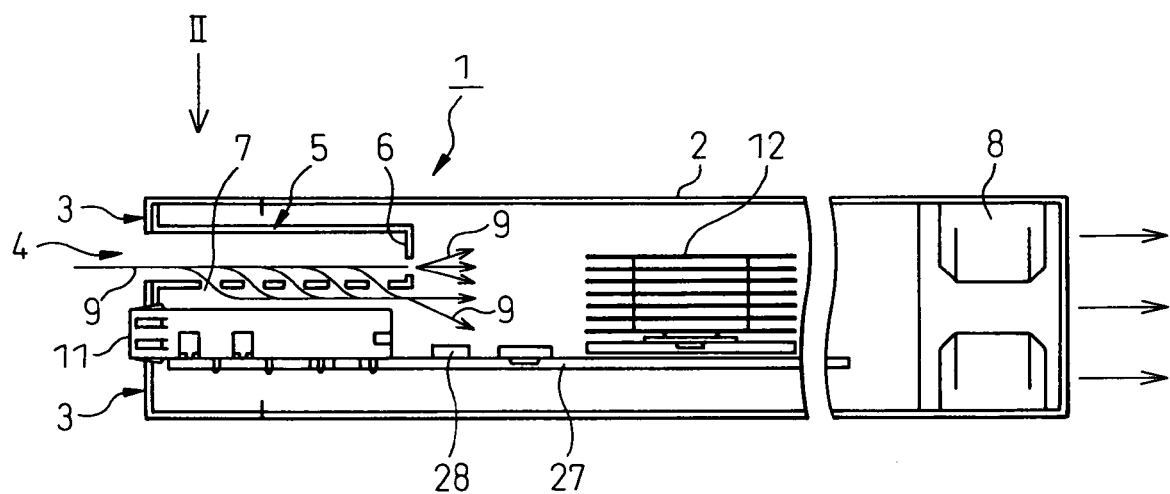
FIG. 5 is a sectional view taken along the line A-A of FIG. 3.

FIG. 3 is an overall perspective view of a cooling device 1 according to a first embodiment of the present invention; FIG. 4 is a partially enlarged view of FIG. 3; and FIG. 5 is a sectional view taken along the line A-A in FIG. 3. Note that FIG. 5 is exactly the same as FIG. 1 explained first.

The first embodiment shown in FIG. 3 to FIG. 5 is characterized in that, in short, when the predetermined cooled element in the case 2 is the first cooled element 11 arranged laterally long along the front surface 3, the air duct 5 is provided with a wall 6' facing this first cooled element 11 and, at the same time, a group of small openings 7 is provided in at least the wall 6' among the plurality of walls 6.

According to the drawings, the first cooled element 11 is an electronic circuit part constituted by an RJ-45/SFP module. This module 11 has a small temperature guaranteed range as already explained, therefore needs strong cooling. For this reason, the inflowing air 9 is centrally blown from the group of small openings 7 provided in the wall 6' just above that toward this module 11. In this case, it is sufficient so far as the group of small openings 7 is provided in the wall 6', but in the example of FIG. 3 to FIG. 5, groups of small openings 7 are provided in all of the four walls, and the inflowing air 9 reaches up to the deep portion in the case 2. In the present invention, the intake port 4 in the front surface 3 is completely open unlike the conventional example. There is nothing obstructing the inflow of the air. Therefore, a large amount of air can easily enter into the air duct 5. In other words, it can be considered that the area of the conventional intake port 4 is enlarged substantially several times (by exactly the number of walls 6) in the present invention. For this reason, the intake port 4 which could take only a small area within the limited range of the height of the front surface 3 can be substantially enlarged.

Figure 6:
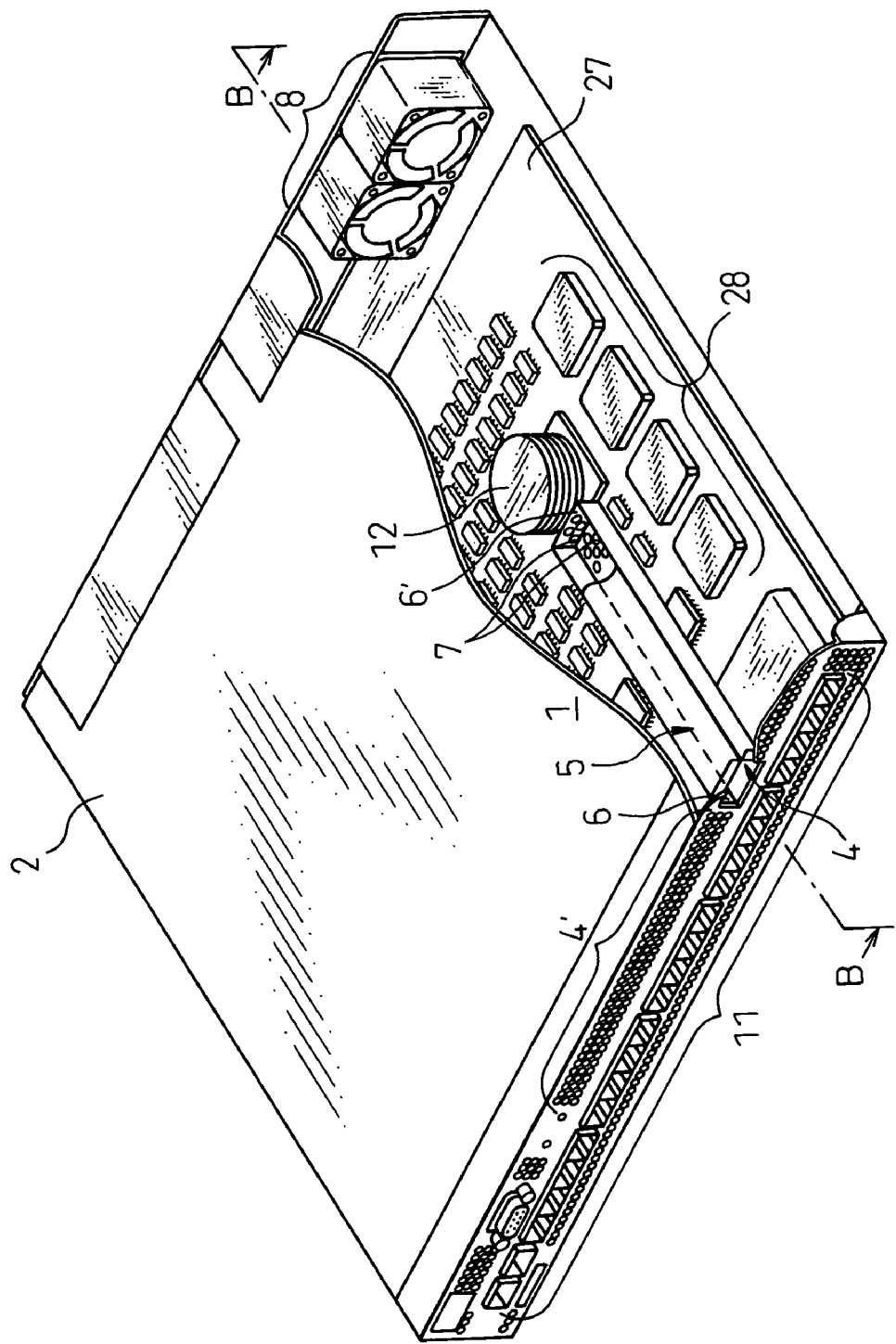
FIG. 6 is an overall perspective view of a cooling device according to a second embodiment of the present invention.
Figure 7:
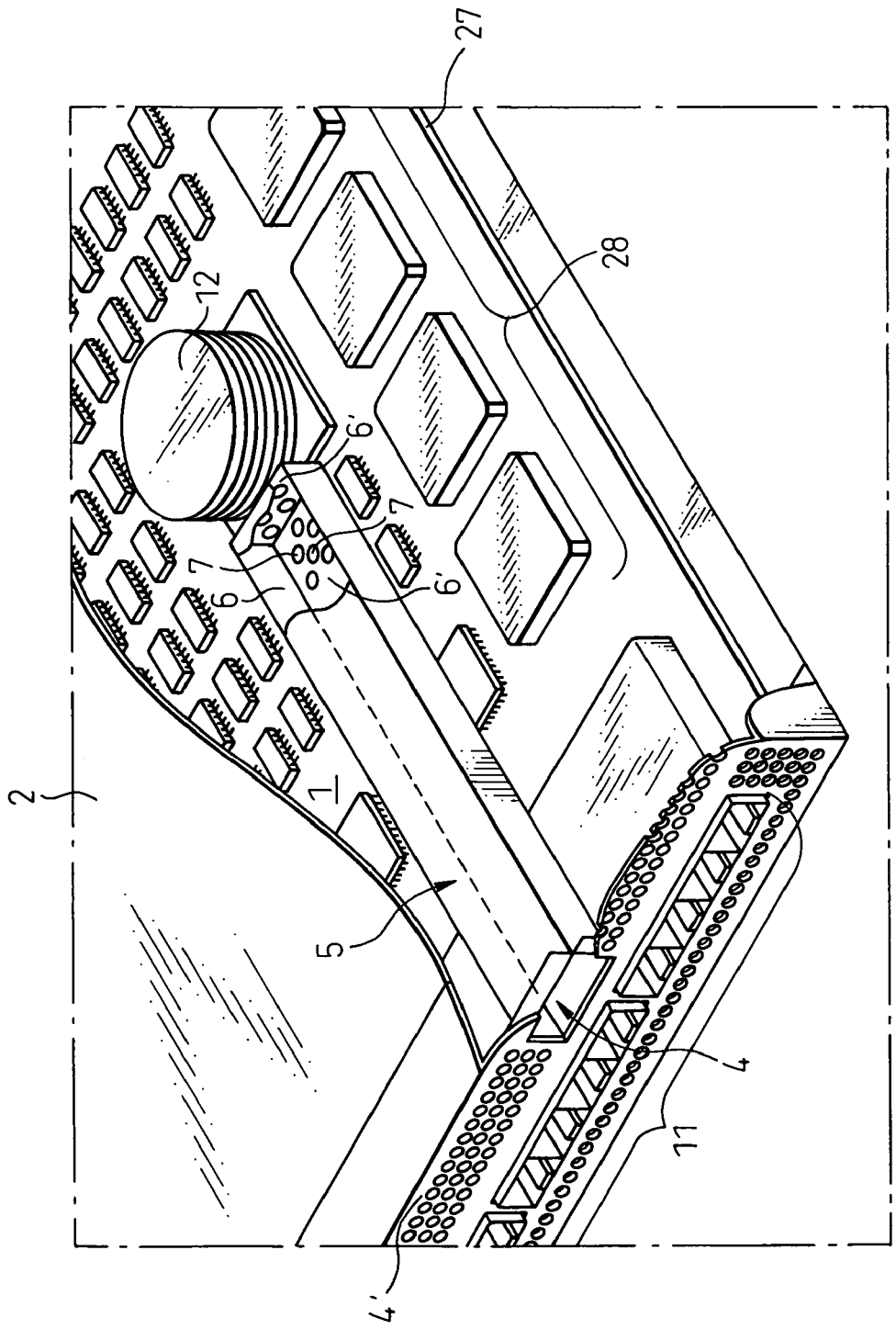
FIG. 7 is a partially enlarged view of FIG. 6.

FIG. 6 is an overall perspective view of a cooling device 1 according to a second embodiment of the present invention; FIG. 7 is a partially enlarged view of FIG. 6; and FIG. 8 is a sectional view taken along the line B-B in FIG. 6.

Figure 8:
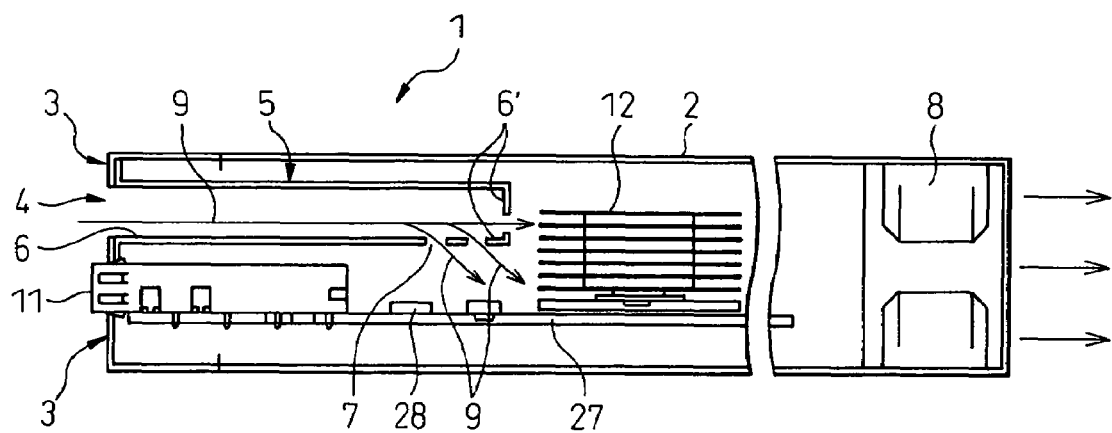
FIG. 8 is a sectional view taken along the line B-B of FIG. 6.

The second embodiment shown in FIG. 6 to FIG. 8 is characterized in that, in short, when the predetermined cooled element in the case 2 is the second cooled element 12 arranged away from the front surface 3, the air duct 5 is extended vertically long up to this second cooled element 12 and, at the same time, the group of small openings 7 is provided in at least a wall 6' located in the vicinity of this second cooled element 12 among the plurality of walls.

According to these drawings, the second cooled element 12 is an LSI equipped with heat radiation fins as the electronic circuit part. This LSI 12 generates considerably high heat, so needs concentrated cooling. In the cooling of the conventional example (refer to FIG. 23), however, a sufficient amount of inflowing air 9 could not be selectively supplied to this LSI 12. According to the present invention, sufficient inflowing air can be concentratedly fed to this LSI 12.

Figure 22:
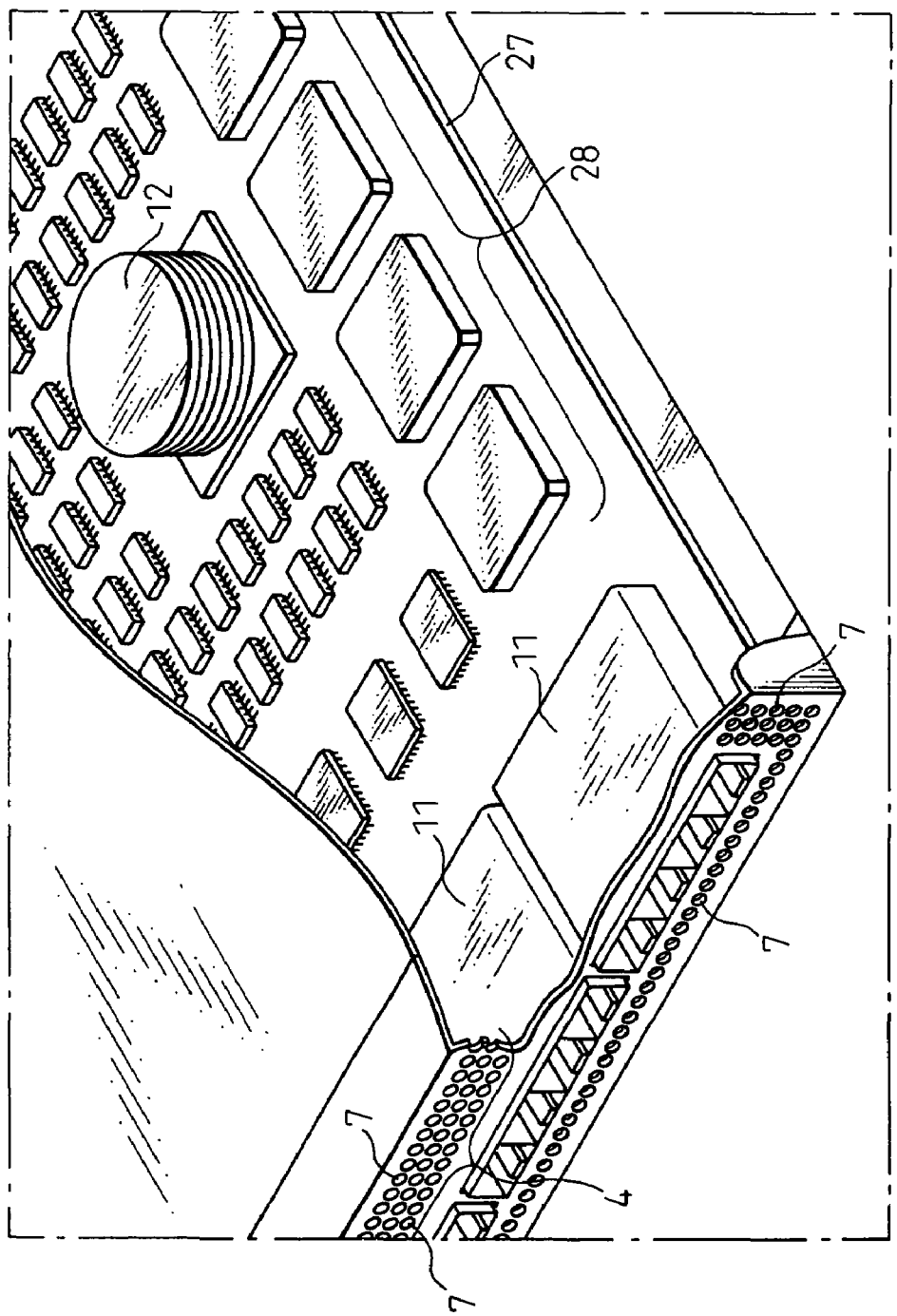
FIG. 22 is a partially enlarged view of FIG. 21.

Note that, in this case, the intake port 4 according to the present invention becomes an opening having a small area, therefore, at the front surface 3, the region other the portion for forming this intake port 4 is made an intake port 4' having a group of small openings 7 as in the conventional case (same as 4 of FIG. 20 to FIG. 22).

Figure 9:
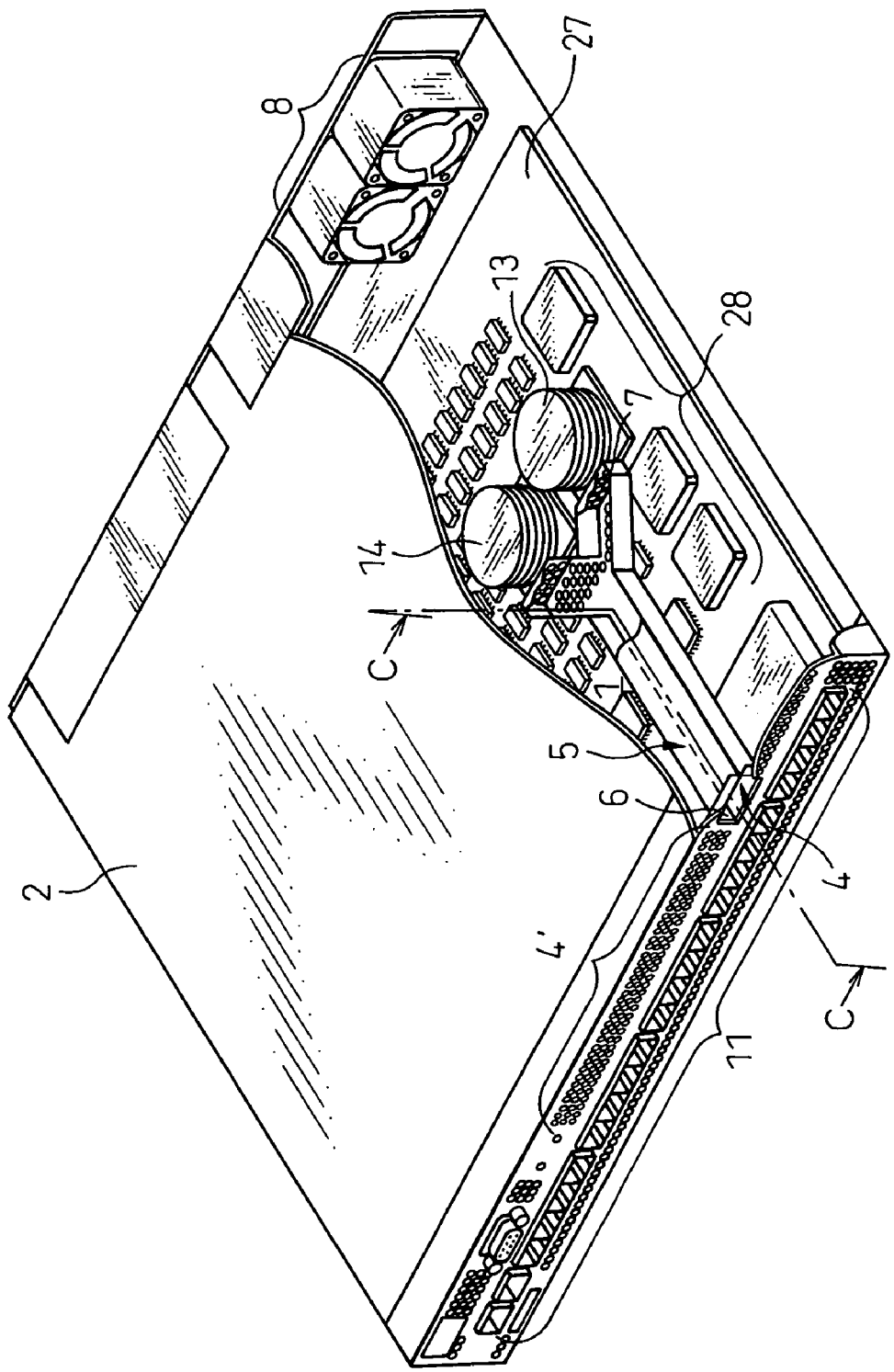
FIG. 9 is an overall perspective view of a cooling device according to a third embodiment of the present invention.
Figure 10:
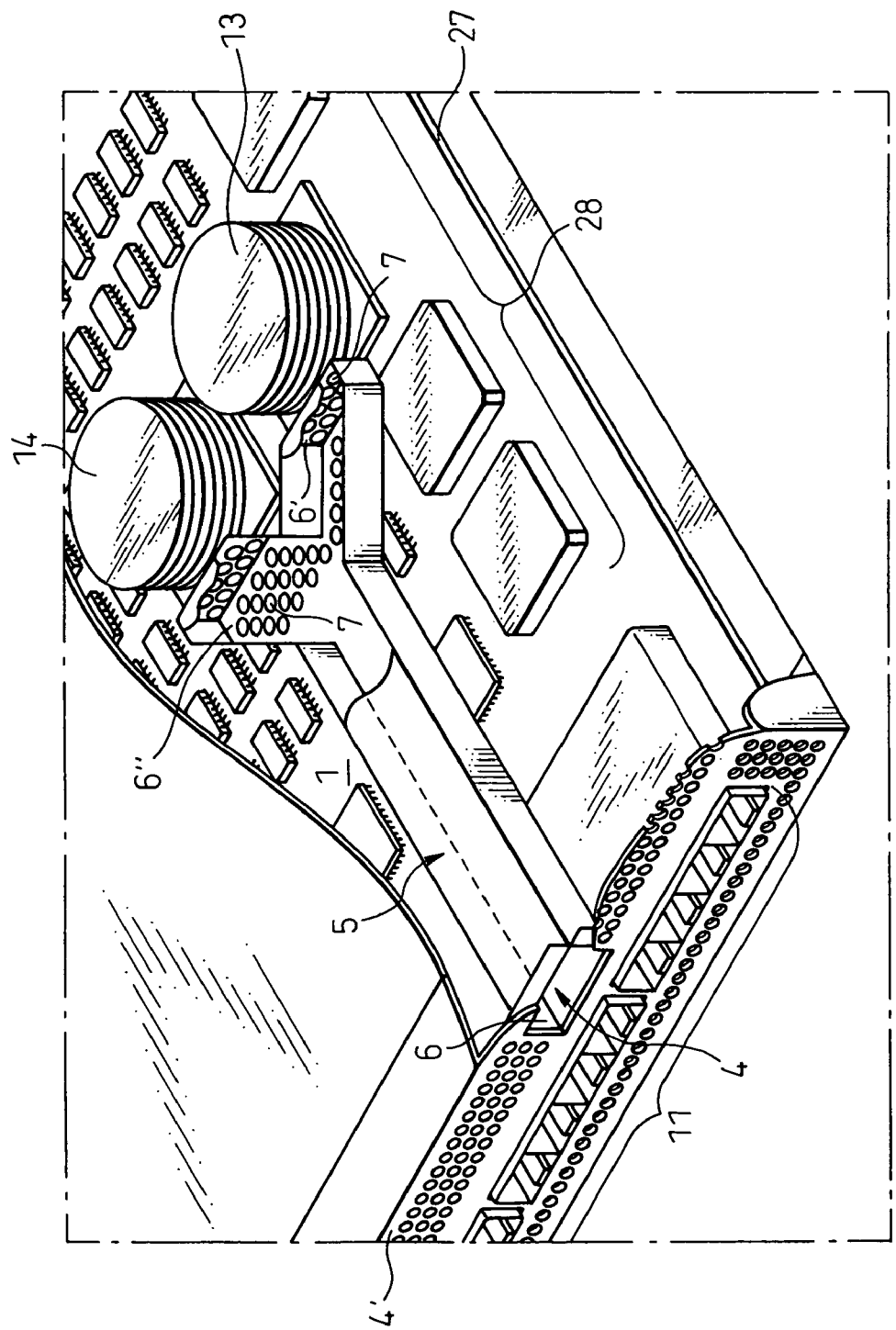
FIG. 10 is a partially enlarged view of FIG. 9.

FIG. 9 is an overall perspective view of a cooling device 1 according to a third embodiment of the present invention; FIG. 10 is a partially enlarged view of FIG. 9; and FIG. 11 is a sectional view taken along the line C-C in FIG. 9.

Figure 11:
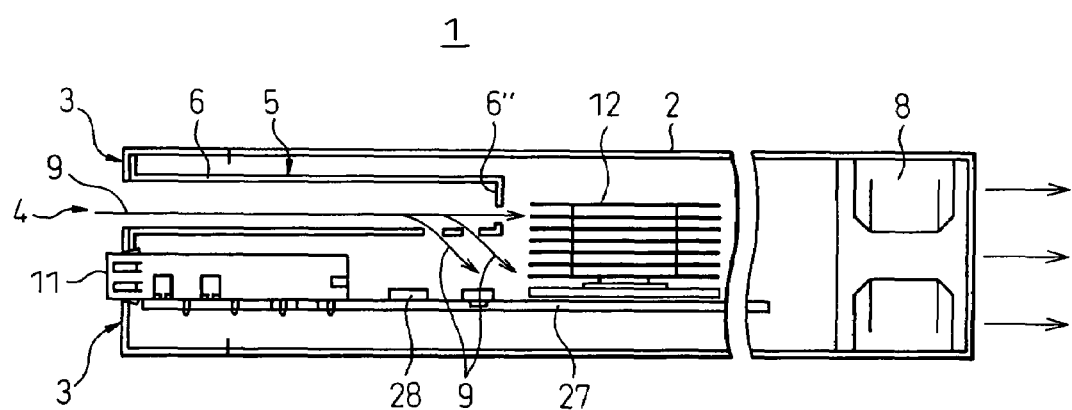
FIG. 11 is a sectional view taken along the line C-C of FIG. 9.

The third embodiment shown in FIG. 9 to FIG. 11 is characterized in that, in short, when the cooled elements in the case 2 are a third cooled element 13 and a fourth cooled element 14 arranged away from the front surface 3, the air duct 5 is extended vertically long up to the vicinity of these third and fourth cooled elements 13 and 14 and further extended while being branched in a schematic Y-shape up to a position close to these third and fourth cooled elements 13 and 14 and in that groups of small openings 7 are provided in at least walls 6' and 6" facing these third and fourth cooled elements 13 and 14 among the plurality of walls.

According to these drawings, the above third cooled element 13 is an LSI equipped with heat radiation fins, and the fourth cooled element 14 is an LSI equipped with the same heat radiation fins. In FIG. 9 and FIG. 10, an example in which the front end of the air duct 5 is branched into two is shown, but it may be branched to three if necessary. Thus, the cooling air can be supplied to a plurality of heat generating bodies at the center of the case 2 simultaneously and in sufficient amounts. Note that the portion of the intake port 4 was made the same as the case of the second embodiment shown in FIG. 6 to FIG. 8.

Figure 12:
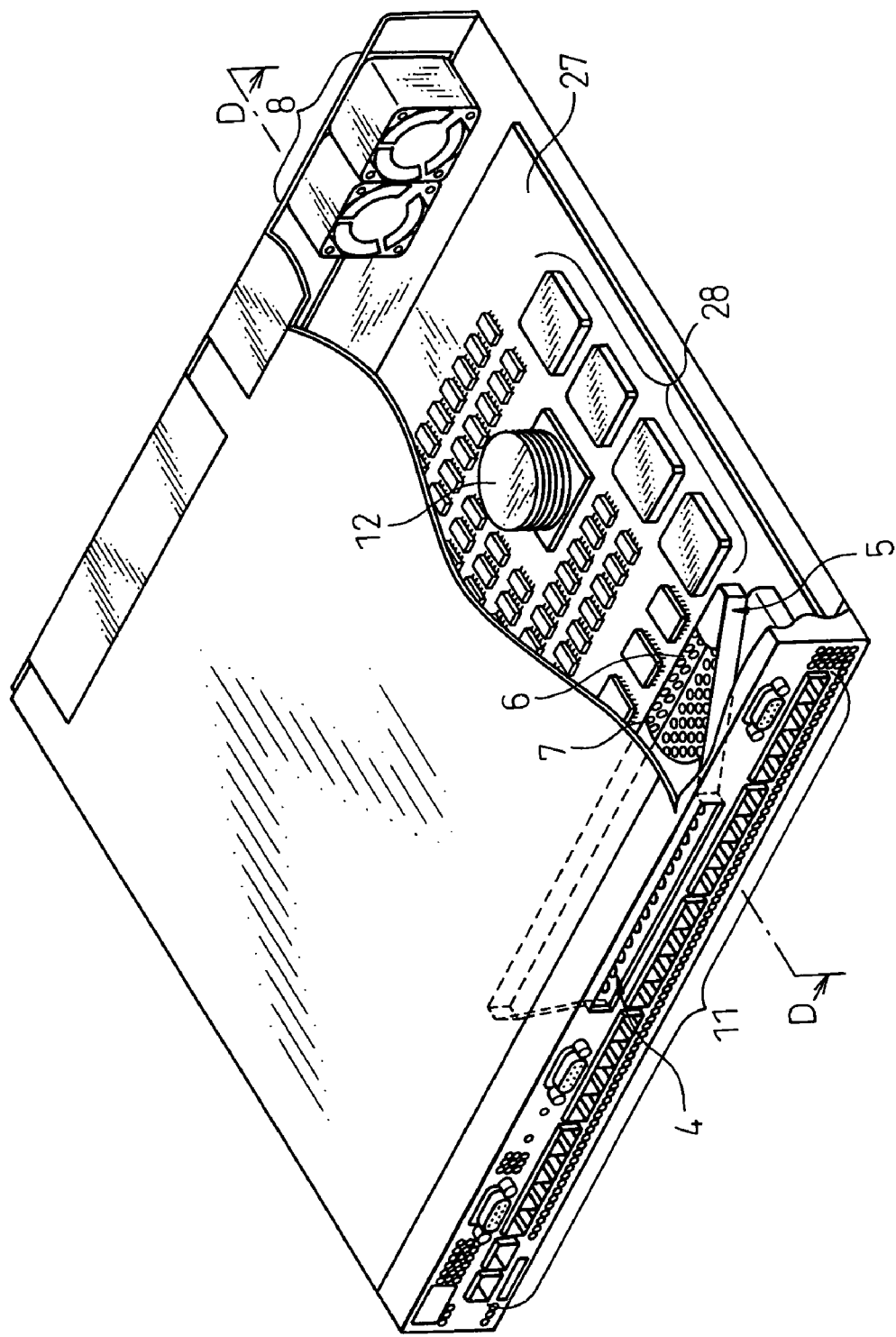
FIG. 12 is an overall perspective view of a cooling device according to a fourth embodiment of the present invention.
Figure 13:
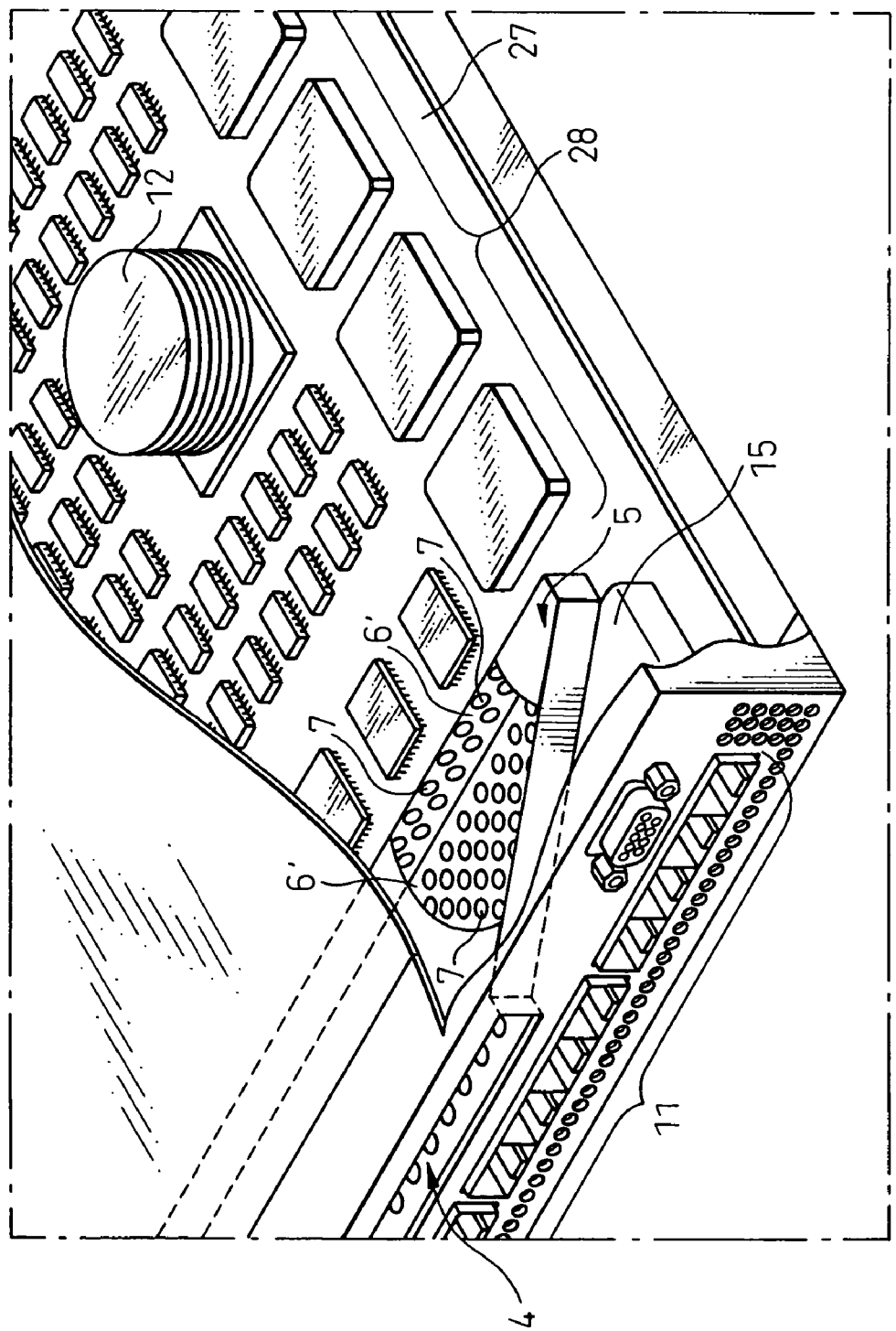
FIG. 13 is a partially enlarged view of FIG. 12.
Figure 14:
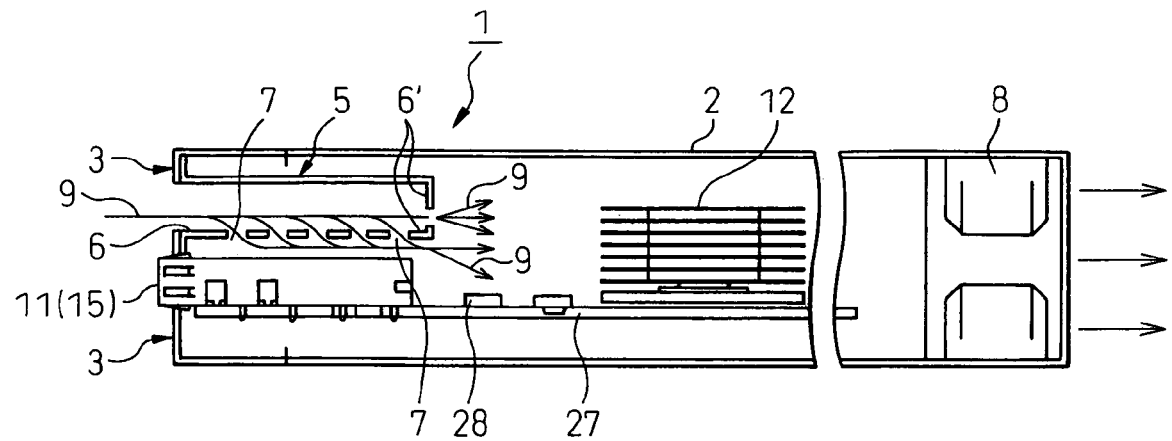
FIG. 14 is a sectional view taken along the line D-D of FIG. 12.

FIG. 12 is an overall perspective view of a cooling device 1 according to a fourth embodiment of the present invention; FIG. 13 is a partially enlarged view of FIG. 12; and FIG. 14 is a sectional view taken along the line D-D in FIG. 12. The fourth embodiment shown in FIG. 12 to FIG. 14 is characterized in that, in short, when the predetermined cooled element in the case 2 is a fifth cooled element 15 arranged with a broader lateral width than the lateral width of the intake port 4, the air duct 5 is radially spread from this intake port 4 and the group of small openings 7 is provided in at least a wall 6' facing the fifth cooled element 15 among the plurality of walls.

According to these drawings, the above fifth cooled element 15 is the already explained RJ-45/SFP module and an IC group forming a local heat generating part in the vicinity of the same.

The first to fourth embodiments of the cooling device according to the present invention were explained above. A common component of these embodiments is the group of small openings 7. When considering this, each opening of these groups of small openings 7 is formed by a hole having an opening diameter based on the operating frequency of the electronic circuit considering the above EMC. More specifically, the opening diameter can be calculated from the following known equation:

$$S = 10 \log(\lambda/2L) \quad [1]$$

where, S is a shield effect [dB], L is the maximum length [m] of a slot, and $\lambda$ is a wavelength [m].

When the operating frequency ($\lambda$) of the electronic circuit described above is determined or the shield effect (S) expected in the design of the electronic circuit is determined, the pore diameter is determined as L from the above Equation [1].

Figure 15A:
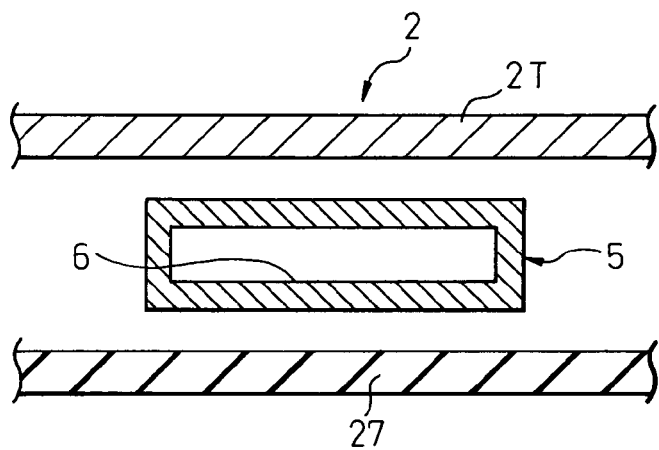
FIG. 15A is a sectional view showing the structure of an independent type air duct.

Further, as a common subject of the first to fourth embodiments explained above, there is the structural design of the air duct 5. When considering this, the following structure can be employed. FIG. 15A is a view showing the structure of an independent (separate) type air duct in cross-section; while FIG. 15B is a view showing the structure of a shared air duct in cross-section.

Figure 15B:
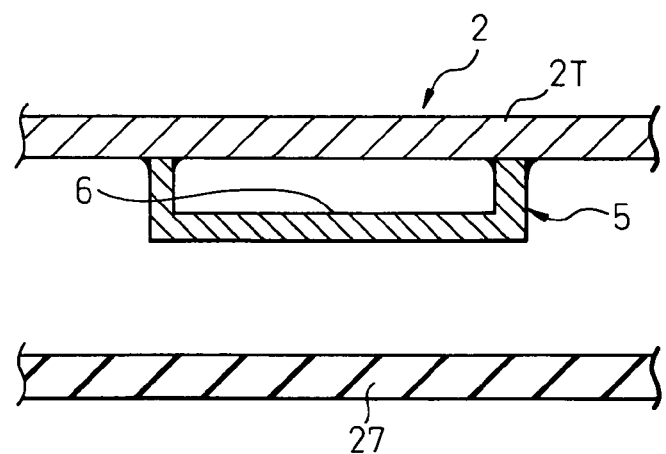
FIG. 15B is a sectional view showing the structure of a shared air duct.

In FIG. 15A and FIG. 15B, 2 indicates the case and particularly a top surface plate 2T thereof, 6 indicates a cross-section of the wall of the air duct 5, and 27 indicates a cross-section of a printed circuit board. For the air duct 5 in the case of FIG. 15A, the cross-section of the wall 6 viewed on a plane perpendicular to the flow of the inflowing air 9 (direction vertical to the sheet surface) forms a schematically rectangular shape. This is an independent type with respect to the case 2.

On the other hand, in the case of FIG. 5B, the wall on the side facing the top surface plate 2T of the case 2 among the walls 6 having cross-sections forming a schematically rectangular shape is formed by sharing this top surface plate. Namely, this is the shared type together with the case 2. In the case of this shared type, when the top surface plate 2T of the communication device 20 is detached, the air duct 5 is detached together. Therefore, maintenance and inspection of the electronic circuit parts (28) on for example the printed circuit board 27 become easy.

Finally, various performances will be compared for the case of an air duct according to the present invention and the case of no air duct of the conventional example.

FIG. 16 is a view showing the amount of air in a comparison with the conventional example; FIG. 17 is a view showing the temperature in comparison with the conventional example; FIG. 18 is a view showing the amount of air due to individual cooling in comparison with the conventional example; and FIG. 19 is a view showing the temperature due to individual cooling in comparison with the conventional example. Note that all figures show the results by simulation.

When viewing FIG. 16 first, the graph is obtained by measuring the amount of air at each of three measurement points in the case of the communication device (referred to as the "device"), that is, the front surface of device/lower portion of air duct, center of device, and back surface of device, in which a white bar graph indicates the case of no air duct (conventional) and a hatched bar graph indicates the case of an air duct (present invention). At all measurement points, it is seen that the amount of air for cooling increases more than the conventional case (see FIG. 2).

When viewing FIG. 17 next, the graph measures each temperature at three measurement points in the device, that is the front surface of the device/case of SFP module, atmosphere of center portion of device, and the back surface of the device. It is seen that the present invention is excellent in cooling capability in comparison with the conventional example at all measurement points. Particularly, the case temperature of the SFP module becomes lower than the conventional temperature by 10° C. or more.

Further, when viewing FIG. 18 and FIG. 19, these graphs show the results of measurement for the amount of air and temperature in the embodiment of FIG. 7 explained above, that is, an individual cooling type device. In this example, the results are obtained by selecting the fin front surface of an LSI (12) equipped with fins and the fin case itself as the measurement points thereof and measuring the amounts of air and temperatures thereof. When viewing particularly FIG. 19, the fin case temperature according to the present invention becomes lower than the conventional temperature by about 40° C., so it is seen that the cooling effect according to the present invention is extremely conspicuous.

While the above explanation was mainly given with reference to cooling of the communication device, the present invention is not limited to this. The present invention can be utilized for cooling in general devices or apparatuses where various parts accompanied by heat generation are arranged in one case.

What is claimed is:

1. A cooling device provided in a case provided with at least an intake port provided at a front surface and an exhaust fan for sucking in air from the intake port onto a predetermined element and cooling the predetermined element, the cooling device comprising:
    an air duct extending partially inside said case;
    the predetermined cooled element in said case is a cooled element arranged laterally along said front surface; and
    the air duct provided with a wall having small openings facing said predetermined cooled element,
    wherein said cooled element and other cooled elements contained in said case are electronic circuits, and each of said small openings is formed by a hole having an opening diameter in accordance with an operating frequency of the electronic circuit considering an electromagnetic compatibility (EMC).

2. A cooling device as set forth in claim 1, wherein said wall forming a schematically rectangular shape in cross-section.

3. A cooling device as set forth in claim 2, the wall on the side facing a top surface plate of said case forming a schematically rectangular shape in cross-section is formed by sharing the top surface plate.

4. A cooling device as set forth in claim 1, wherein said cooled element is a pluggable module.

5. A cooling device as set forth in claim 4, wherein said pluggable module is a RJ-45/small form-factor pluggable (SFP) module.

6. A cooling device case, comprising:
    an intake port provided at a front surface of the cooling device case; and
    an exhaust fan for sucking in air from the intake port onto a pluggable module in the cooling device case, the pluggable module arranged laterally along the front surface of the cooling device case; and
    an air duct extending partially inside said cooling device case and comprising a wall having small openings facing said pluggable module,
    wherein said cooled element and other cooled elements contained in said case are electronic circuits, and each of said small openings is formed by a hole having an opening diameter in accordance with an operating frequency of the electronic circuit considering an electromagnetic compatibility (EMC).

7. The cooling device case as set forth in claim 6, wherein said pluggable module is an RJ-45/small form-factor pluggable (SFP) module.

8. A cooling device case, comprising:
    an electronic circuit in the cooling device case, and
    an air duct extending partially inside said cooling device case and comprising a wall having a small opening facing a pluggable module and the small opening is formed by a hole having an opening diameter in accordance with an operating frequency of the electronic circuit considering an electromagnetic compatibility (EMC).

* * * * *